United States Patent [19]

Karsten, Jr. et al.

[11] Patent Number: 5,144,257

[45] Date of Patent: Sep. 1, 1992

[54] DISTRIBUTED ARRAYS OF MICROELECTRONIC AMPLIFIERS

[75] Inventors: Kenneth S. Karsten, Jr., Bethlehem; Frank F. Francisco, Easton, both of Pa.

[73] Assignee: ITT Corporation, New York, N.Y.

[21] Appl. No.: 767,511

[22] Filed: Sep. 30, 1991

[51] Int. Cl.$^5$ ............................................... H03F 3/60
[52] U.S. Cl. ................................. 330/54; 330/124 R
[58] Field of Search .................... 330/53, 54, 55, 56, 330/57, 124 R, 286, 295, 307

[56] References Cited

U.S. PATENT DOCUMENTS

| | | | |
|---|---|---|---|
| 4,780,684 | 10/1988 | Kosmahl | 330/54 |
| 4,901,028 | 2/1990 | Gray et al. | 330/54 |
| 4,987,377 | 1/1991 | Gray et al. | 330/54 |

Primary Examiner—Steven Mottola
Attorney, Agent, or Firm—Arthur L. Plevy; Patrick M. Hogan

[57] ABSTRACT

A distributed array of microelectronic triodes constitutes a series of banks of triodes arranged in a concentric configuration. Each triode in the bank is a microelectronic triode fabricated by semiconductor integrated circuit techniques. Triodes in each individual bank are arranged in a parallel or other configuration whereby each of the triodes operate to provide increased power in regard to input signals applied to each bank. The array of triodes is capacitively coupled so that each of the banks contributes to the total output power. The coupling is provided for by capacitive coupling with biasing being accommodated by resistor biasing networks which are also integrated circuit components. The output power from the array is taken through a common output coupling configuration which configuration is connected to a suitable cylindrical member which operates to respond to the total output power of the array to enable the output power to be utilized in other suitable microwave components such as a coaxial line or a waveguide.

24 Claims, 4 Drawing Sheets

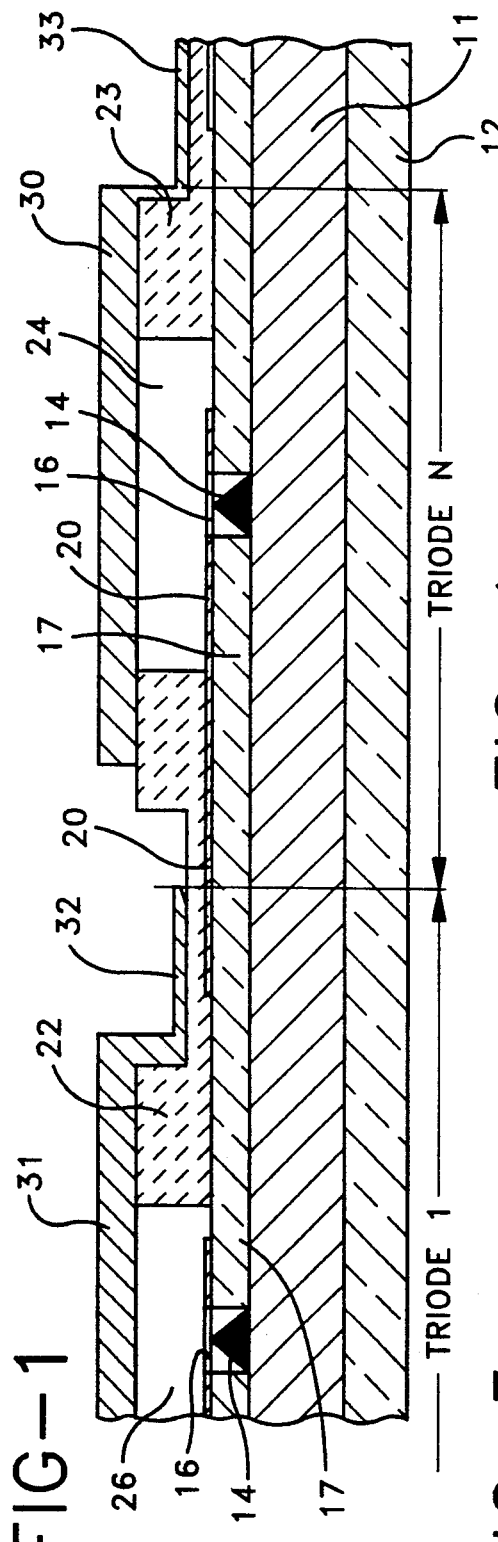
FIG-1
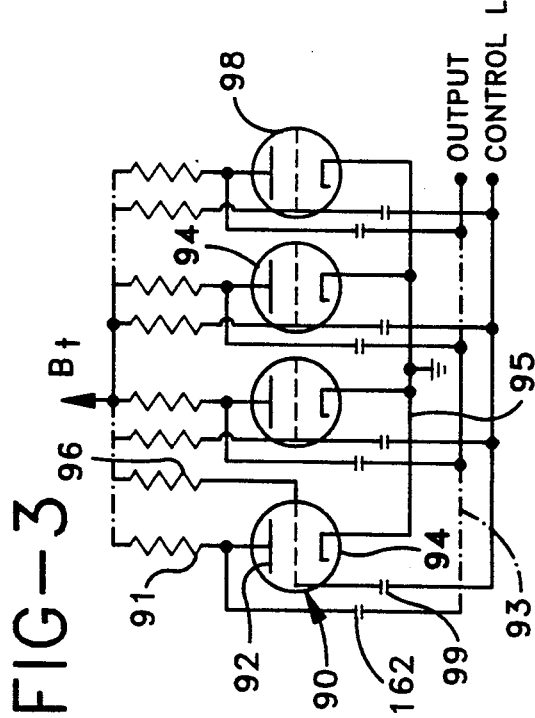
FIG-4
FIG-3

DISTRIBUTED ARRAYS OF MICROELECTRONIC AMPLIFIERS

FIELD OF THE INVENTION

This invention relates to microelectronic triode devices and more particularly to distributed triode bank arrays of such amplifier devices to increase power output.

BACKGROUND OF THE INVENTION

The microelectronic triode is a device which is fairly well known in the prior art. Such a device combines optimized solid state and vacuum tube capabilities. Essentially, the triode operates as a vacuum tube triode but utilizes integrated circuit techniques for fabrication. Such devices are required for microwave frequency applications requiring fairly large power, such as in the utilization of active antenna arrays in electronic countermeasures, radar and communications systems.

Vacuum microelectronic triodes have been described which operate up to 300 GHz and have been widely discussed in the literature. See, for an example, an article entitled "Frequency Limits of Electronic Tubes with Field Emission Cathodes" by W. A. Anderson published at the Second International Conference on Vacuum Microelectronics, Bath, 1989. See also a publication entitled "A Wide Bandwidth, High Gain Small Sized Distributed Amplifier with Field Emission Triodes (FETRODES) for the 10 to 300 GHz Frequency Range" by H. G. Kosmahl, IEEE Transactions on Electron Devices, Vol. 36, No. 11, Nov. 1989. See also an article entitled "An X-Band Tuned Amplifier with a Field-Emission Cathode" by P. M. Lally, Y. Goren, E. A. Netteshein, published in the IEEE Transactions on Electron Devices, Vol. 36, No. 11, Nov. 1989.

As indicated, these devices are based on conventional vacuum tube triode operation but are fabricated utilizing integrated circuit techniques. Such devices employ a lateral topology with strip line interconnects or a vertical scheme that places many triodes in parallel or in series. The parallel outputs combine to increase the overall current available from a single field emitter tip by the number of triodes in parallel or in the bank while the series arrangement increases gain. The term "bank" is utilized to describe a plurality of parallel triodes which essentially are arranged in a bank or other configuration. The construction of such triodes utilizing integrated circuit techniques is extremely well known in the prior art and many examples exist as indicated by the above references. The use of parallel outputs which are combined to increase the overall current is also well known in the art as can be ascertained by many references. See, for example, an article entitled "Field Emission Cathode Array Development for High Current Density Applications" by C. A. Spindt, C. E. Holland, R. D. Stowell published in 1983 in Applied Surface Science, Vol. 16, Pages 268-276. The technique of paralleling tubes or triodes to increase current and power is a well known technique. See, for example, "Theory and Applications of Electron Tubes" published by McGraw-Hill Book Company, Inc., 1939 by H. J. Reich. In regard to this, multiple parallel tube arrangements were also known in the prior art and utilized conventional vacuum tubes. To obtain more power output, several tubes were used together if care was taken to suppress moding which tends to occur when some dimension of the combining circuitry used becomes large in terms of the wavelength. In any event, utilizing prior art techniques involve great difficulty. The physical geometries of the cathode, grid (gate) and plate affect the gain and the upper frequency limit. Other factors such as the coupling and biasing networks also had adverse effects on operation. Thus in such schemes, such as employing vertical schemes the biasing required was only specified on a schematic basis and the techniques do not address the manufacturing requirements. The lateral schemes utilize strip line interconnects that occupy a large portion of the array and thus decrease the array power density.

It is therefore an object of the present invention to provide a distributed array of microelectronic amplifiers which array enables the coupling of large numbers of microelectronic amplifiers without the problems attended in the prior art.

It is a further object of the present invention to provide a distributed triode bank array which constitutes a large power amplifier consisting of a plurality of microelectronic triodes.

SUMMARY OF THE INVENTION

A distributed triode array for providing increased power operation at microwave frequencies, comprising a plurality of banks of vacuum microelectronic triodes each bank comprising a plurality of microelectronic triodes on an integrated circuit substrate wherein the plurality of triodes in each bank are interconnected by capacitive coupling devices formed in said substrate and including biasing means formed in said substrate, said plurality of banks arranged on said substrate according to a concentric pattern manifested in that there is a central bank of microelectronic triodes, with a first even number of banks of said plurality of banks disposed about said central bank on a first concentric pattern, with each bank in said first number of a segmented configuration and symmetrically disposed about said central bank, and with a second even number of banks greater than said first number disposed about a second larger concentric pattern and each bank in said second number of a segmented configuration and symmetrically disposed about said central bank and symmetrically disposed about said first even number of banks, an outer concentric coupling pattern disposed about said second concentric pattern and coupled to said first and second banks for receiving power from each of said concentric banks, and a concentric biasing ring disposed about said outer coupling pattern and coupled to said biasing means for biasing each of said plurality of banks.

BRIEF DESCRIPTION OF THE FIGURES

FIG. 1 is a cross-sectional view of typical microelectronic triodes;

FIG. 2 is a top topological view of a distributed amplifier arrangement according to this invention;

FIG. 3 is a schematic diagram of one type of distributed amplifier bank which can be employed in the invention;

DETAILED DESCRIPTION OF THE INVENTION

Figure 4:
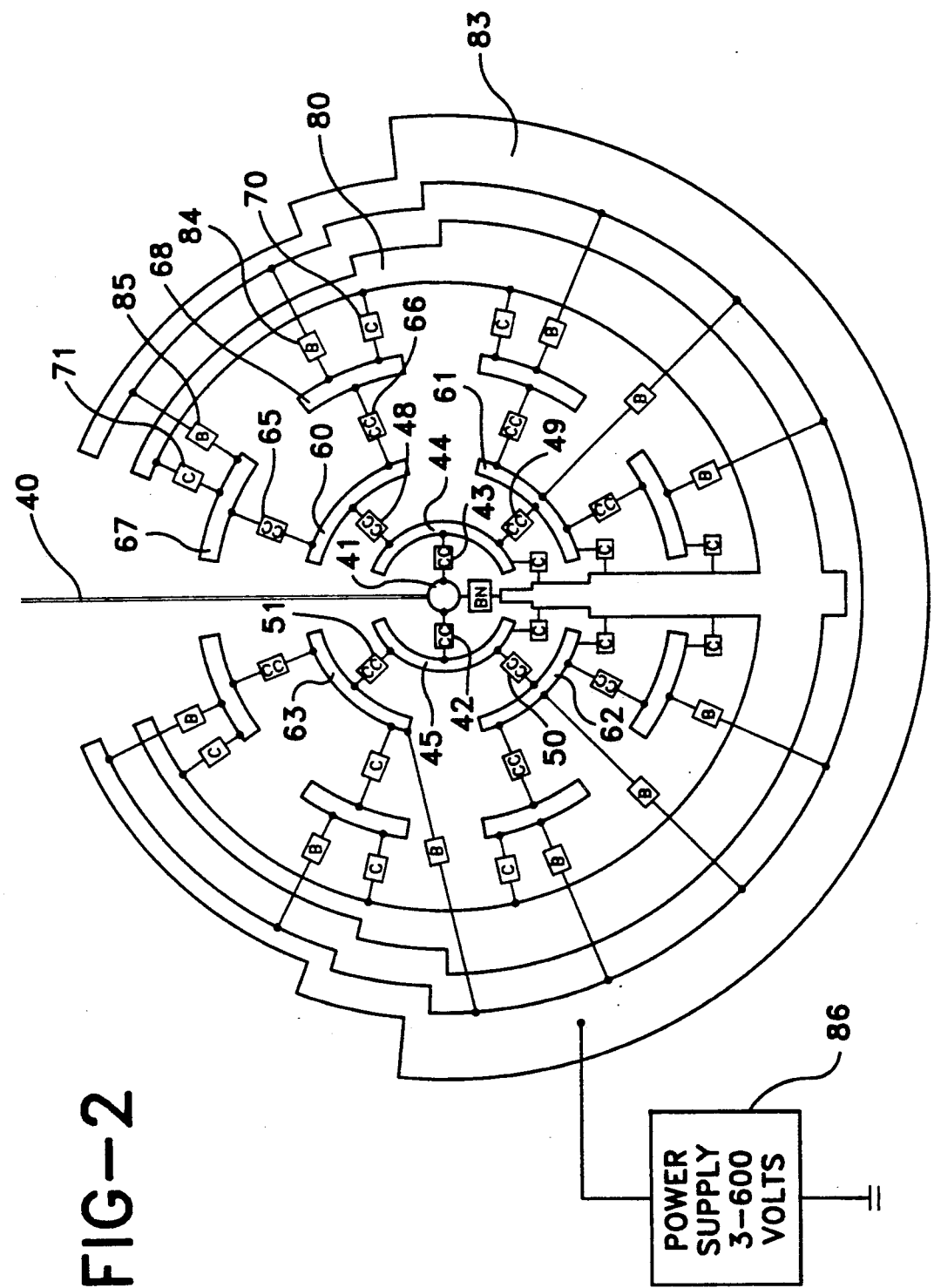
FIG. 4 is a schematic diagram of another type of amplifier bank which can be employed in the invention.

Before proceeding with a detailed description of the present invention, the following comments are believed to be applicable.

During the development of the microelectronic triode the conventional terminology employed in vacuum tubes as, for example, designating the electrodes of a triode as the grid electrode, the plate or anode electrode and the cathode electrode, have been oftentimes substituted with the word "emitter" electrode for the cathode, and "gate" electrode for the grid electrode. This terminology of course emanates from integrated circuit terminology, drawing an analogy between the grid electrode and the gate electrode of a field effect transistor. Therefore, the terms are used synonymously.

Referring to FIG. 1 there is shown a cross-sectional view of two typical microelectronic triodes as employed in the present invention. Before describing the triodes shown in FIG. 1 in detail, it is indicated that the above-noted references as well as other references, fully describe vacuum microelectronic triodes and the geometric limits on the emitter, gate, and plate electrodes for high frequency operation. Thus the size of the various elements as well as the construction of a microelectronic triode is not an aspect of the present invention but it is the distribution and coupling of the plurality of triodes that the present invention is concerned with. Referring to FIG. 1 there is shown a common cathode designated by reference numeral 11. The common cathode 11 is a metal which has a relatively low work function and is a refractory metal such as tungsten or molybdneum. Such materials can operate as a cathode in such devices. The common cathode is a layer of metal material which is deposited on a suitable substrate 12. The substrate 12 may be alumina, ceramic or some other supporting material such as GaAs. Upon the substrate 12 the common cathode 11 is RF sputtered or otherwise deposited. The shape of the cathode may be any geometrical configuration and can be semi-circular in configuration. As one understands, the difference between a metal, a semiconductor and an insulator is related to the relative bandgap between the valance band and the conduction band. In particular, the Fermi level for the metal is immersed in a continuum of allowed energy states, while in the semiconductor, the Fermi level lies between two bands of allowed states. The energy difference between the free electron energy and the average electron energy (or Fermi) level is called the work function. Thus in a metal, the electron affinity is the same as its work function. In this manner, one can develop cathodes which are designated in the field as cold cathodes and essentially emit electrons based on the work function of the material. Hence the cathode preferably should be fabricated from a metal that has a relatively low work function. As seen, the cathode is associated with triangular projections as 14 which are emitter tips. The emitter tips 14 are conical, pyramidal and/or hollow projections which emanate from the cathode 11 and which, because of their geometry, enable high fields to be developed between the grid and the tips of the emitters. In this manner high electrical fields are produced about the tips when a bias is applied to the device. Electrons are then drawn out of the tips or the cathode material 11 and are directed towards the grid electrodes and then to the plate electrode. The emitter tips 14 and the cathode have been referred to as cold cathode devices. Therefore the cathode as well as the tips 14 are fabricated from refractory materials and are designated in the prior art as field emitters which include photo enhanced field emitting devices. One can also employ ballistic emitter devices which use the tunneling effect. All of these are well known in the art. As explained, the layer of metal 11 is deposited upon the substrate 12 by means of conventional integrated circuit techniques such as RF sputtering or a suitable plating technique. The structure and shape of the cathode is provided by means of conventional masks as utilized in standard integrated circuit techniques. Hence a mask which is associated with a given annular pattern as will be described is provided to enable one to deposit the metal cathode on the substrate according to any desired geometrical shape. The use of photo-lithographic techniques employed in integrated circuit fabrication are well known. As seen, each of the emitter tips 14 is retained within an aperture 16 formed in an insulating layer 17, which layer 17 is deposited on top of the metal layer 11 by means of conventional integrated circuit techniques. The insulating layer 17 may be silicon dioxide or silicon nitride and deposited upon the metal 11 by well known conventional semiconductor processing techniques. Thus it is indicated that the semiconductor processing techniques used for fabricating integrated circuits are used to fabricate the microelectronic triode as shown in FIG. 1. Disposed upon the surface of the insulator layer 17 after the formation of the apertures 16 is a metal grid electrode 20. The grid or gate electrode 20 extends as shown and overlies the emitter tips 14. The grid electrode basically is fabricated from a refractory metal as indicated above and has apertures on the surfaces to allow electrons to penetrate from the emitting surface of the emitter tips 14 through the grid so that they travel to the plate electrodes. The grid electrodes are fabricated as shown. Deposited upon the grid electrodes and upon the insulator 17 is a further insulating layer 22. Layer 22 is an insulating layer which operates in conjunction with a vacuum space 24. Formed on the insulating layers as, for example, 22 is the insulator for the first plate electrode 31 and a second plate electrode 30. The plate electrodes are again fabricated from refractory metals and are deposited as shown in the cross-section. The hollows 24 and 26 essentially are vacuum cavities associated with each vacuum triode. The formation of vacuum cavities in conjunction with such triodes is well known. As one can ascertain from FIG. 1, there is shown two microelectronic triode devices (Triode 1 and Triode N). Each device is associated with an emitter tip as 14, has a vacuum hollow 26 and 24, and has its own plate electrode as 30 and 31. Also shown connected to the plate are capacitive couplers 32 and 33. The capacitive couplers essentially are metalized strip structures which emanate from the plate to enable capacitive coupling to the gate or grid electrode. For example, coupler 32 forms a capacitor with grid 20 with the insulator layer 22 between the capacitive coupler member 32 and the grid 20 acting as a dielectric to form a capacitor. In this manner the plate electrode 31 of the first triode is capacitively coupled to the grid or gate electrode 20 of the second triode with the plate electrode 30 of the second triode connected to the capacitive coupler 33 which can then couple to another triode mechanism. As one can see from FIG. 1, there is shown a very simple integrated circuit version of a microelectronic triode which can be repeated numerable times by techniques well known in the art. Utilizing conventional integrated circuit techniques, one can therefore fabricate any triode configuration in any geometrical shape or arrangement as desired. Such triode configurations can be fabricated together with biasing resistors in different layers of the semiconductor substrate. Such techniques are extremely well known. It is the interconnection of banks of triodes which is the major aspect of the present invention.

Referring to FIG. 2 there is shown a top view of a distributed triode bank array according to this invention. The array shown in FIG. 2 utilizes integrated circuit fabrication techniques to achieve effective capacitive coupling in an extremely small space so that the techniques are applicable to both vertical and lateral emitter configurations. The configuration shown feeds a bank of triodes in parallel which bank is capacitively coupled to outer banks in a circular fashion. These annular rings branch out in segments that are fabricated using standard integrated circuit techniques as briefly described in FIG. 1 and employ metalizing and insulating layers to obtain any pattern desired. Biasing networks using standard integrated circuit techniques for fabricating resistors are created in vertical layers for a complete space effective amplifier scheme, as will be further explained and as briefly explained in conjunction with FIG. 1. In the topological view of FIG. 2 there is shown a series of circular segments arranged about the circumference of a series of concentric circles. As will be explained, a center bank of triodes 41 is partially surrounded by circular segments 44, 45 constituting separate amplifier banks and which are capacitively coupled to the central bank 41 via capacitive couplers 42 and 43. The banks 44 and 45 are two in number and are positioned on the circumference of a first circle. A second circle of a larger diameter contains four amplifier banks as 60, 61, 62 and 63. A third still larger diameter circle contains 8 amplifier banks as 67 and 68, and so on. As one can see, the circular segments constituting amplifier banks are symmetrically disposed about the circumference of the associated circle and symmetrically disposed with respect to one another. In any event, as shown in FIG. 2 there is a gate control line 40. The gate control line is coupled to the central amplifier bank 41. The module 41 may contain a plurality of microelectronic triodes as those shown in FIG. 1. Each of the plate electrodes of the triodes are coupled via capacitive coupling modules designated as 42 and 43 to separate banks of triode amplifiers. A bank of triode amplifiers is shown in circular segment 44 while another bank is in circular segment 45. It is noticed that segments 44 and 45 are completely symmetrical and centered around the core bank of amplifiers 41. In a similar manner, the segments 44 and 45 are now coupled through capacitive coupling networks 48, 49, 50 and 51 to circular segments which consist of other banks of triode amplifiers as, for example, 60, 61, 62 and 63. In turn, these banks of amplifiers arranged as circular segments are coupled to outer amplifier banks whereas, for example, the annular segment or bank of amplifiers 60 is coupled via capacitive coupling networks 65 and 66 to outer peripheral banks of amplifiers 67 and 68. The banks 67 and 68 are capacitively coupled via capacitive couplers 70 and 71 to an outer coupling ring 80. The outer coupling ring 80 is a layer of metal which is formed as shown and which essentially receives power from the entire bank of amplifiers. While the FIGURE shows only the outer amplifier banks 67 and 68 coupled to the ring 80, it is understood that any of the banks such as 60, 61, 62 and 63 can also be so coupled to the outer peripheral ring. Biasing for each of the amplifier banks is obtained from an outer concentric biasing ring 83 which couples to each amplifier bank via biasing networks such as 84 associated with circular segment or bank 68 and 85 associated with segment or bank 67. These biasing networks essentially consist of resistors which are formed within the integrated circuit. In this manner as one can see, the entire configuration consists of banks of triode amplifiers which are multiple emitter banks cascaded together in terms of the concentric circles, allowing the circles to progress outwardly. The coupling scheme employs overlapping segments where the upper segment is a plate from the preceding triode or triode bank and the lower segment is the grid of the next stage. Each layer is amenable to integrated circuit fabrication as indicated. Thus the triode banks are arranged as shown in FIG. 2 with a bank of triodes, for example, existing in circular segments as 67 and 68 as well as, for example, in segments 60 and 61. Each bank of triodes is arranged with a given number of triodes in parallel or fully individual biased triodes in each bank. The number of triodes in each bank depends upon the gain of the device feeding it. Thus if the gain is 5, for example, each triode would drive 5 triodes and so on until the total gain is obtained. Gains of 10 to over 60 dB are possible. Output coupling through a final parallel combination of the output triode banks to the coupling ring 80 completes the circuit configuration. The arrangement shown in FIG. 2 is amenable to both vertical gated emitters as well as lateral gated topologies. For emitter current densities of 500 microamperes per tip as, for example, tips 14 and a plate efficiency of 25% RF output powers of up to 30 watts are possible for distributed triode bank arrays with a total moderate gain of 25-30 dB. Thus the distributed triode bank array shown in FIG. 2 can be configured as a microwave power module (MPM). In this way, each of the annular segments as 67 may contain, for example, 3-10 or more triodes as depicted in FIG. 1. While the configuration shown essentially portrays concentric circles, other geometric configurations could be employed as well, including linear arrays. Thus concentric geometrical patterns such as triangular, rectangular, octagonal, etc. structures are applicable. Each triode in the bank can be separately arranged as an amplifier, and so on. There are numerous configurations available to obtain large power outputs from microwave devices, and schematic examples of such configurations will be given. Again referring to FIG. 2, the symmetry of the distribution is particularly noted.

As indicated, in the center of the concentric circular configuration is a first bank of microelectronic triodes 41. The bank 41 can be a circular array. As one progresses outward from the center of the circle, there is a left and a right segment, namely, 44 and 45 which essentially are mirror images of one another and symmetrically disposed about the center circle 41. The next or third ring comprises four circular segments or banks of microelectronic triodes 60, 61, 62 and 63. As seen, each are 90 degrees apart with respect to their centers. It is also seen that the four segments in the second circle are symmetrically disposed with respect to segments 44 and 45. In the third ring extending outwards from the center there are located eight annular segments which, again, are symmetrically disposed with respect to the four annular segments and the two annular segments. The geometry of the configuration is extremely important to enable both capacitive coupling between banks as well as to enable biasing of all amplifiers. While the segments are shown to be circular in structure, the integrated circuits that are fabricated according to the techniques shown briefly in FIG. 1 are such that they are essentially fabricated in a circular manner whereby the plates as well as the coupling rings and other items are, in fact, fabricated in circular segments to produce the composite structure seen. The integrated circuit as formed consists of multiple layers with each layer containing portions of the different devices. It is again emphasized that it is not the integrated circuit microelectronic triodes that are the invention, but it is the distribution which is depicted in FIG. 2 that constitutes the main aspect of the present invention.

Referring to FIG. 3 there is one form of an amplifier which can be implemented very simply by microelectronic triode configurations. As seen, there is a triode 90 which is formed according to the techniques described in conjunction with FIG. 1. The triode 90 has a plate electrode 92 which is coupled via a resistor 91 to a source of potential which is B+. The plate is also coupled via a coupling capacitor 162 to an output line 93. The cathode electrode of the triode designated as 94 is coupled to a common terminal 95 and to a point of reference potential. The grid electrode or gate electrode of the triode 90 is coupled through a resistor 96 to B+. Such microelectronic triodes operate with B+ voltages between 3-600 volts with 500 volts being a typical potential. Thus a power supply 86 of FIG. 2 supplies a bias or operating potential between 3 to 600 volts. The grid and plate electrodes can both be operated at this voltage level. As one can see from FIG. 3, there is shown a plurality of additional triodes such as 97 and 98 all of the same circuit arrangement as described for triode 90 coupled as indicated. Each of the grid electrodes is coupled through a capacitor as capacitor 99 for triode 90 to a control line to enable each of the triodes to receive a signal from the line and to provide an amplified signal at the plate electrode through the respective plate load as 91 for microelectronic triode 90. In this manner multiple triodes can be arranged in large banks, say 10, 20 or 30, or more and implemented using the configuration shown in FIG. 3.

Referring to FIG. 4 there is shown still another configuration. In FIG. 4 a triode 100 is shown having a plate, grid and cathode electrode with the cathode electrode 101 coupled to a point of reference potential with the grid electrode coupled to a control line via capacitor 102 with the plate electrodes of the triodes connected together through one single resistor 103 to a source of potential B+. Each grid electrode is further coupled through a resistor as 104 to B+. The plate electrodes of the triodes are coupled through a capacitor 105 to the output. The resistor 104, for example, would be connected to the coupling ring 80 as shown in FIG. 2 or to a separate coupling circular strip segment. Biasing for the B+ would be provided by means of ring 83 to enable each bank of triodes whether it be the configuration shown in FIG. 3 or FIG. 4, to have B+ applied. The resistors such as 103 and 104 would be implemented in the integrated circuit configuration as is known in the art.

Figure 5:
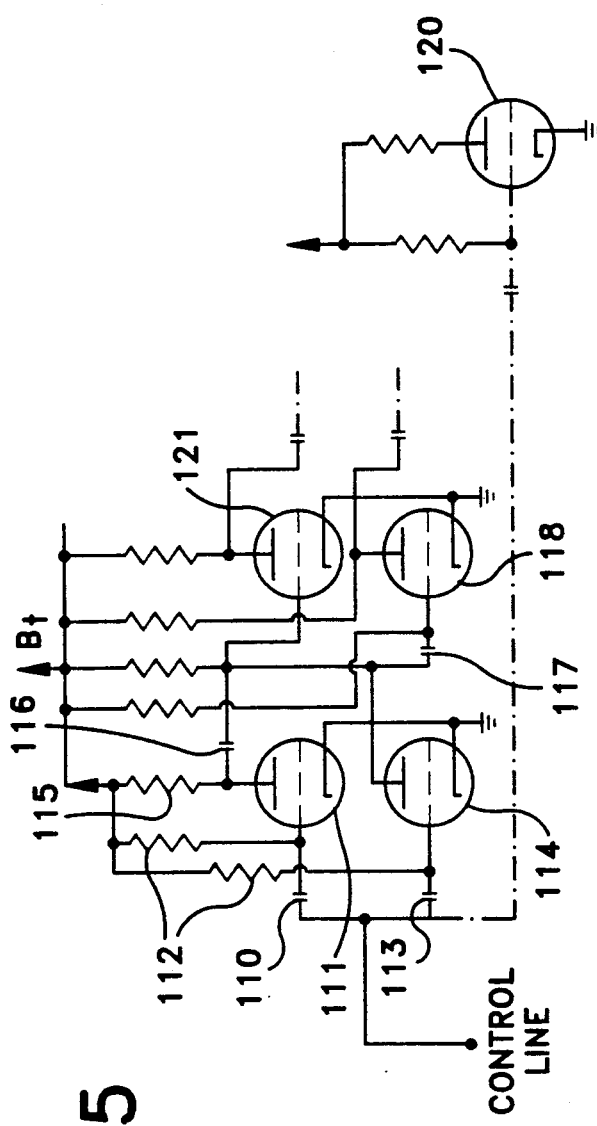
FIG. 5 is a schematic diagram of still another type of amplifier bank which can be employed in the invention.

Referring to FIG. 5 there is shown still another example of an amplifier fabricated according to the array of FIG. 2. The amplifier in FIG. 5 essentially is a distributed amplifier whereby the plate electrode of a triode as 111 is capacitively coupled via capacitor 116 to the gate or grid electrode of a following amplifier stage, such as stage 121. It is seen, for example, that the triode 111 has the cathode electrode connected to other cathode electrodes and returned to the point of reference potential with the plate electrode of triode 111 connected through a resistor 115 to B+. Thus as shown in FIG. 5, there are parallel banks of distributed amplifiers whereby a single control line can feed multiple lines of distributed amplifiers all fabricated with the microelectronic triode.

Figure 6:
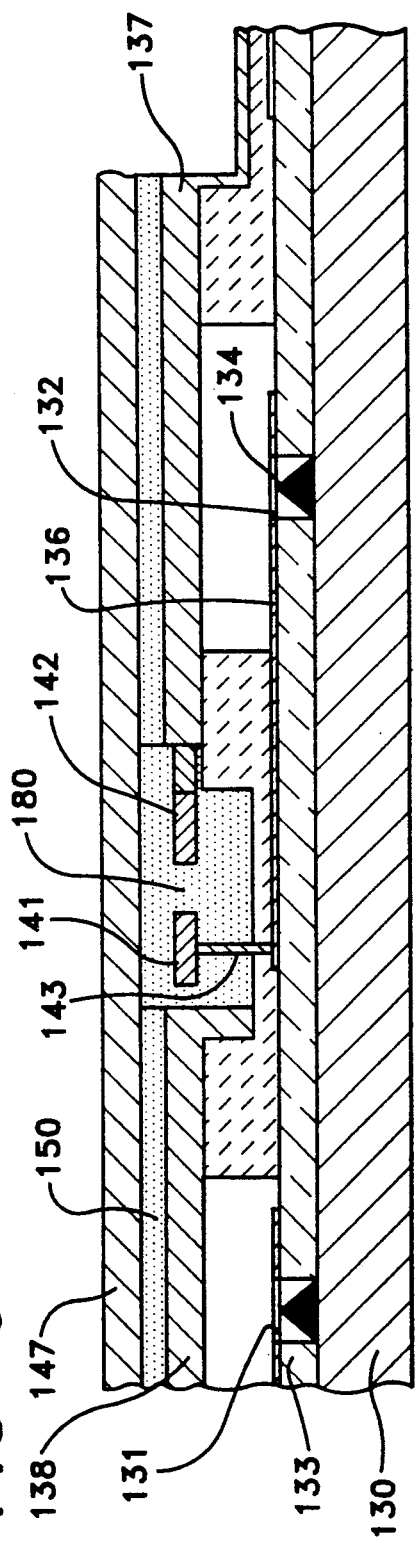
FIG. 6 is a cross-sectional view of another vacuum triode arrangement according to this invention.

Referring to FIG. 6 there is shown still another integrated circuit configuration attempting to show constructions of devices as depicted schematically above. Again, numeral 130 references a common cathode which, as indicated, is deposited by integrated circuit techniques on a convenient substrate which is not shown. The common cathode 130 is associated again with the emitter tips 131 for a first triode and emitter tip 134 for a second triode. An insulating layer such as silicon dioxide as 133 is deposited to and apertures are formed as 132 to isolate the emitter tips. The grid is a metalized member 136 which again is deposited by integrated circuit techniques via an appropriate mask. The grid or gate electrode has apertures distributed throughout the surface thereof to allow electrons which emanate from the emitter tip to travel towards the plate electrode of one of the triodes designated as 137 for one triode and designated by reference numeral 138 for the other triode. As seen, there is a further layer of insulator 140 deposited therein whereby resistors as 141 and 142 can be conventionally deposited in the layer. These resistors can be connected to the plate electrode or to the grid electrode by metalization paths as, for example, path 143, a vertical path connecting to the grid electrode 136. Other metalization paths can directly connect the resistor to the metalized plate electrode, or the integrated circuit resistor can be connected to the plate or grid electrode directly as each design may dictate. As is well known, the resistors as shown schematically in FIG. 6 are line patterns fabricated from suitable metal deposited on insulators. The fabrication of semiconductor resistors utilizing metalized patterns is well known in the art and hence such resistors as 141 and 142 can be utilized as the biasing networks and deposited in suitable layers in the substrate. Also shown in FIG. 6 is a top metal layer 147 which can again be the circular segment or coupling ring. It is noted that the spacing between, for example, the plate electrode 138 and the ring 147 includes an insulator 150, which insulator can, as indicated above, form the dielectric for a capacitor and hence the plate 138 would be capacitively coupled to the outer ring in one embodiment of the integrated circuit. Referring to FIG. 2 it is not shown that any of the annular arrays underlie the ring, however, it is, of course, understood that such arrays could be constructed accordingly. Essentially, as one can understand the above-noted invention enables the fabrication of microelectronic triodes which are associated with resistors and capacitors to enable coupling of such devices where the devices are arranged in parallel or distributed arrangements of banks of devices. The banks are then coupled together to form a large amplifier array having a plurality of banks associated with the array to enable the proper power output to be achieved.

Figure 8:
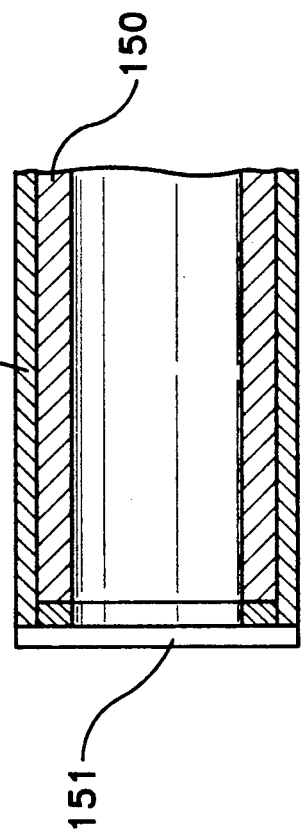
FIG. 8 is a cross-sectional view necessary to explain the coupling apparatus.
Figure 7:
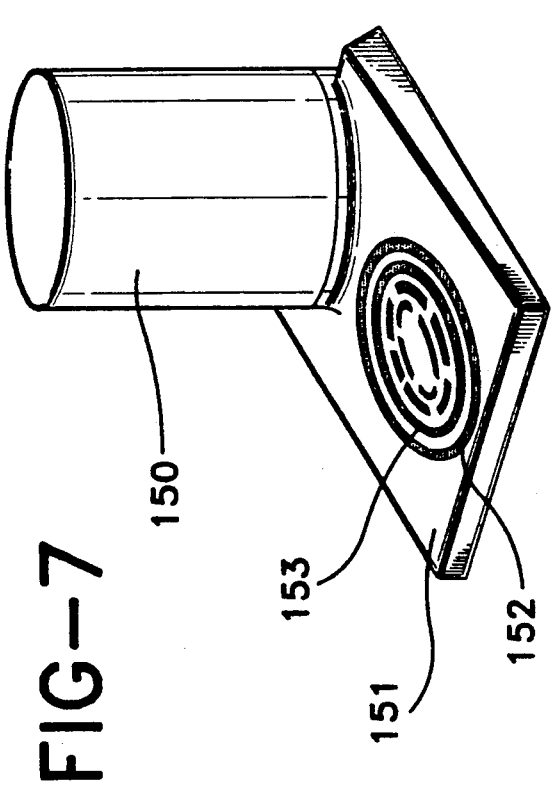
FIG. 7 is a perspective view of an apparatus for coupling to the distributed array of this invention.

Referring to FIG. 7 there is shown a technique of coupling the output power from the distributed array of microelectronic amplifiers to enable one to utilize the total output power from the array. As shown in FIG. 7, numeral 151 refers to the substrate upon which the array is formed as previously described. Associated with the array is an outer biasing ring 152 which ring 152 corresponds to ring 83 of FIG. 2 and is the biasing ring. The inner ring 153 corresponds to coupling ring 80 of FIG. 2 and is the ring to which all the amplifiers in the array or all the banks of amplifiers in the array are coupled. Thus ring 153 contains the total power emanating from the array. Shown positioned above the substrate is a metal cylinder 150. The cylinder 150 is of a diameter equal to the diameter of ring 153 and essentially the cylinder 150 is placed upon the surface of the ring 153 and secured thereto by a suitable bonding technique such as a metal bonding utilizing gold or silver, for example, as a contact. In this manner the total power from ring 153 causes skin currents to circulate in the cylinder, thus producing the high output power in the cylinder. As shown in a cross-sectional view of FIG. 8, the cylinder 150 can function as a center conductor of a coaxial line and hence power now travels from the distributed array on substrate 151 through the cylinder 150 down the coaxial line which may be further covered by a suitable sheath or outer conductor 160.

Figure 9:
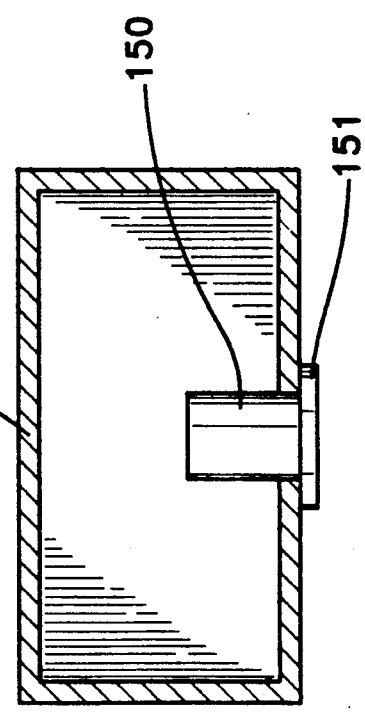
FIG. 9 is a partial cross-sectional view depicting another way of employing the invention to energize a waveguide.

FIG. 9 shows a waveguide 170 having the cylinder 150 acting as a center post for the waveguide to thereby launch a $TE_{10}$ mode waveform in the waveguide. Hence the structure shown can be utilized to activate or launch a wave in a typical waveguide or a waveguide fed antenna or/and active antenna array or a single dipole antenna.

Figure 10:
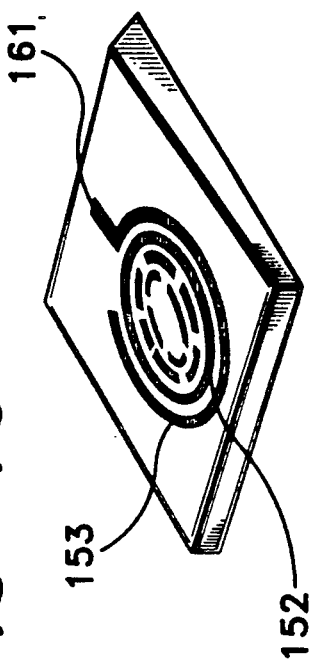
FIG. 10 is a perspective view of another embodiment.

FIG. 10 shows the output coupling ring 153 interchanged with the biasing ring 152. Ring 153 is also broken (at top) to form an arcuate or curved stripline. The stripline curves away from the amplifier for connection to an output device at terminal 161. The interchangeability of the coupling ring 153 with ring 152 is independent of the final output coupling scheme. The coupling ring 153 is broken and hence not a full circle but being more than two hundred and seventy degrees but less than three hundred and sixty degrees.

In summation and as one can understand from the above, the distributed triode bank array utilizes integrated circuit fabrication techniques to achieve effective capacitive coupling in a space conserving manner that is applicable to both vertical and lateral emitter configurations. The configuration feeds a bank of triodes in parallel which is capacitively coupled to outer banks in a circular fashion. These rings branch out in segments that are fabricated using standard integrated circuit techniques for metalizing and growing insulating layers. Biasing networks using standard integrated circuit techniques for fabricating resistors and other components are created in vertical layers for a completely space effective amplifier scheme. Capacitive coupling occurs between the metalized elements of the vacuum microelectronic triode and the insulator which is overlaid on the metal and which forms capacitive coupling to adjacent devices. Virtually any configuration of distributed amplifier arrays can be formulated in banks providing that the configuration of the entire array is maintained as described herein. While symmetry is employed, there are configurations envisioned which may not possess total symmetry but which will suffice. It is noted that the concentric patterns are needed but can be, as indicated, rectangular, triangular, and so on.

We claim:

1. A distributed triode array for providing increased power operation at microwave frequencies, comprising:
   a plurality of banks of vacuum microelectronic triodes each bank comprising a plurality of microelectronic triodes on an integrated circuit substrate wherein the plurality of triodes in each bank are interconnected by capacitive coupling devices formed in said substrate and including biasing means formed in said substrate, said plurality of banks arranged on said substrate according to a concentric pattern manifested in that there is a central bank of microelectronic triodes, with a first even number of banks of said plurality of banks disposed about said central bank on a first concentric pattern, with each bank in said first number of a segmented configuration and symmetrically disposed about said central bank, and with a second even number of banks greater than said first number disposed about a second larger concentric pattern and each bank in said second number of a segmented configuration and symmetrically disposed about said central bank and symmetrically disposed about said first even number of banks, an outer concentric coupling pattern disposed about said second concentric pattern and coupled to said first and second banks for receiving power from each of said concentric banks, and
   a concentric biasing ring disposed about said outer coupling pattern and coupled to said biasing means for biasing each of said plurality of banks.

2. The distributed triode array according to claim 1, wherein said concentric patterns are circular patterns as concentric rings with said segmented patterns being semi-circular segmented configurations.

3. The distributed triode array according to claim 1, wherein each bank of vacuum microelectronic triodes comprises:
   a substrate having deposited thereon a common cathode layer of a refractory metal;
   a first insulator layer deposited on said common cathode layer, said insulator layer having apertures which surround and accommodate emitting tips formed on said common cathode and extending therefrom;
   a metalized gate electrode deposited on said insulating layer and positioned over said aperture, said gate electrode having apertures therein; and
   a second insulator layer deposited on said first layer on both sides of said apertures with a plate electrode spanning said insulator layers on said both sides with a space between said gate and said plate electrode containing a vacuum whereby electrons emitted from said emitting tips pass through said grid to said plate.

4. The distributed array according to claim 3, wherein said gate cathode and plate electrodes are fabricated from a refractory metal.

5. The distributed array according to claim 4, wherein said metal is selected from tungsten or molybdenum.

6. The distributed array according to claim 5, wherein said insulator layers are silicon dioxide.

7. The distributed array according to claim 6, wherein said insulator layers are silicon nitride.

8. The distributed array according to claim 7, further including a conductive cylinder of a diameter equal to the diameter of said coupling ring and positioned with one open end in contact with said coupling ring to enable power from said coupling ring to propagate on the surface of said cylinder.

9. The distributed array according to claim 8, further including a waveguide having an aperture on a surface for receiving said cylinder to enable said power to propagate in said waveguide.

10. The distributed array according to claim 8, wherein said cylinder is the central conductor of a coaxial cable.

11. The distributed array according to claim 10, wherein said cylinder is one end of a dipole antenna.

12. The distributed triode array according to claim 2, wherein each bank in said plurality contains n triodes, where n is a positive integer greater than one, with the cathode electrodes formed on said substrate as a common electrode and connected to a point of reference potential, with the gate electrodes connected to said biasing ring via a separate integrated circuit resistor for each gate electrode, with each plate electrode connected to said biasing ring via a separate integrated circuit resistor, with each plate electrode capacitively coupled to an output control line for receiving output power from said bank.

13. The distributed triode array according to claim 12, wherein said plate electrodes are capacitively coupled to a control line via metal conductor strips formed integrally with said plate electrode and insulated from a metal control line by an insulator serving as a dielectric.

14. The distributed triode array according to claim 13, wherein said n triodes in said bank are arranged in a semi-circular segmented configuration.

15. The distributed triode array according to claim 1, wherein each bank in said plurality contains n triodes, where n is a positive integer greater than one, with the cathode electrodes formed on said substrate as a common electrode, connected to a point of reference potential, with the plate electrodes connected together and coupled via a single integrated circuit resistor to said biasing ring and with the gate electrodes connected to said biasing ring via individual integrated circuit resistors and capacitively connected to a control line for applying a signal to said grid electrodes and with the plate electrodes capacitively coupled to an output control line for receiving power from said bank.

16. The distributed triode array according to claim 15, wherein said common cathode is a cold cathode having an emitting tip for each of said n triodes.

17. The distributed triode array according to claim 16, wherein said plate, cathode and gate electrodes are metalized strips deposited on said substrate.

18. The distributed triode array according to claim 17, wherein said strips are fabricated from a refractory metal.

19. The distributed triode array according to claim 18, wherein said metal is selected from tungsten, copper, molybdneum or aluminum.

20. The distributed triode array according to claim 19, further including a power supply coupled to said biasing ring.

21. The distributed triode array according to claim 20, wherein said power supply provides an operating voltage between 3-600 volts.

22. The distributed triode array according to claim 1, wherein said outer concentric coupling pattern is broken to form an output microstrip transmission line.

23. The distributed triode array according to claim 22, wherein said concentric coupling pattern is a segmented circular configuration transversing at least two hundred and seventy degrees.

24. The distributed triode array according to claim 23, further including a terminal area coupled to said ring at one end thereof.

* * * * *